United States Patent
Letor et al.

(10) Patent No.: US 12,381,372 B2
(45) Date of Patent: Aug. 5, 2025

(54) ELECTRONIC MODULE FOR GENERATING LIGHT PULSES FOR LIDAR APPLICATIONS AND METHOD FOR MANUFACTURING THE ELECTRONIC MODULE

(71) Applicants: STMicroelectronics S.r.l., Agrate Brianza (IT); STMicroelectronics (Rousset) SAS, Rousset (FR); STMicroelectronics Application GmbH, Aschheim-Dornach (DE)

(72) Inventors: Romeo Letor, Mascalucia (IT); Roberto Tiziani, Nerviano (IT); Alfio Russo, Acireale (IT); Antoine Pavlin, Puyricard (FR); Nadia Lecci, Tremestieri Etneo (IT); Manuel Gaertner, Feldkirchen (DE)

(73) Assignees: STMicroelectronics S.r.l., Agrate Brianza (IT); STMicroelectronics (Rousset) SAS, Rousset (FR); STMicroelectronics Application GmbH, Aschheim-Dornach (DE)

(*) Notice: Subject to any disclaimer, the term of this patent is extended or adjusted under 35 U.S.C. 154(b) by 886 days.

(21) Appl. No.: 17/568,317

(22) Filed: Jan. 4, 2022

(65) Prior Publication Data
US 2022/0214430 A1    Jul. 7, 2022

(30) Foreign Application Priority Data
Jan. 7, 2021    (IT) .................. 102021000000227

(51) Int. Cl.
*H01S 3/00*    (2006.01)
*G01S 7/481*    (2006.01)
(Continued)

(52) U.S. Cl.
CPC ........ *H01S 5/06817* (2013.01); *G01S 7/4815* (2013.01); *G01S 7/484* (2013.01);
(Continued)

(58) Field of Classification Search
CPC .. H01S 5/06817; H01S 5/0239; H01S 5/0428; H01S 5/06216; H01S 5/06835;
(Continued)

(56) References Cited

U.S. PATENT DOCUMENTS 5,736,881 A    4/1998 Ortiz
6,137,816 A    10/2000 Kinbara
(Continued)

FOREIGN PATENT DOCUMENTS

CN    104638509 A    5/2015
CN    211265963 U    8/2020
(Continued)

OTHER PUBLICATIONS

Glaser, "Optimizing performance of a pulsed laser diode driver based on a GaN FET," 2019 IEEE Workshop on Wide Bandgap Power Devices and Applications in Asia (WiPDA Asia), 5 pages.
(Continued)

*Primary Examiner* — Kinam Park
(74) *Attorney, Agent, or Firm* — Seed IP Law Group LLP (57) ABSTRACT

An electronic module for generating light pulses includes an electronic card or interposer, a LASER-diode lighting module, and a LASER-diode driver module. The interposer has an edge recess in which the lighting module is completely inserted. The driver module is arranged on top of the interposer and the lighting module. The electrical connections for driving the LASER diodes are obtained without resorting to wire bonding in order to reduce the parasitic inductances.

20 Claims, 5 Drawing Sheets

(51) Int. Cl.
  *G01S 7/484*     (2006.01)
  *H01S 5/0239*    (2021.01)
  *H01S 5/042*     (2006.01)
  *H01S 5/062*     (2006.01)
  *H01S 5/068*     (2006.01)
  *H01S 5/0683*    (2006.01)
  *G01S 17/931*    (2020.01)
  *H01S 5/0236*    (2021.01)
  *H01S 5/02365*   (2021.01)
  *H01S 5/40*      (2006.01)

(52) U.S. Cl.
  CPC .......... *H01S 5/0239* (2021.01); *H01S 5/0428* (2013.01); *H01S 5/06216* (2013.01); *H01S 5/06835* (2013.01); *G01S 17/931* (2020.01); *H01S 5/0236* (2021.01); *H01S 5/02365* (2021.01); *H01S 5/4025* (2013.01)

(58) Field of Classification Search
  CPC ... H01S 5/0236; H01S 5/02365; H01S 5/4025
  See application file for complete search history.

(56) References Cited

U.S. PATENT DOCUMENTS

| | | | |
|---|---|---|---|
| 6,246,708 | B1 | 6/2001 | Thornton et al. |
| 9,368,936 | B1 | 6/2016 | Lenius et al. |
| 10,802,116 | B2 | 10/2020 | Liero et al. |
| 2003/0016711 | A1 | 1/2003 | Crawford |
| 2015/0002115 | A1 | 1/2015 | Shenoy et al. |
| 2016/0266242 | A1 | 9/2016 | Gilliland et al. |
| 2018/0188360 | A1 | 7/2018 | Berger et al. |
| 2018/0278011 | A1 | 9/2018 | Galvano et al. |
| 2018/0278017 | A1 | 9/2018 | Mignoli et al. |
| 2018/0301875 | A1 | 10/2018 | Burroughs et al. |
| 2019/0229493 | A1 | 7/2019 | Stern |
| 2019/0386460 | A1 | 12/2019 | Barnes et al. |
| 2020/0388987 | A1 | 12/2020 | Moore |
| 2021/0098965 | A1 | 4/2021 | Crawford et al. |
| 2021/0218223 | A1 | 7/2021 | Letor et al. |
| 2021/0333362 | A1 | 10/2021 | Huang et al. |
| 2022/0013982 | A1 | 1/2022 | Pizzardi et al. |
| 2022/0013984 | A1 | 1/2022 | Letor et al. |

FOREIGN PATENT DOCUMENTS

| | | |
|---|---|---|
| EP | 3629462 A1 | 4/2020 |
| JP | 2009260030 A | 11/2009 |
| WO | WO 2018041867 A1 | 3/2018 |
| WO | WO 2020162128 A1 | 8/2020 |

OTHER PUBLICATIONS

LiDAR Teach-In OSRAM PowerPoint slide show, www.osram.com, Jun. 20, 2018, Munich, Germany, 22 pages.

ELECTRONIC MODULE FOR GENERATING LIGHT PULSES FOR LIDAR APPLICATIONS AND METHOD FOR MANUFACTURING THE ELECTRONIC MODULE

BACKGROUND

Technical Field

The present disclosure relates to an electronic module for generating light pulses, in particular for LIDAR applications, and to a method for manufacturing the electronic module. The light pulses may be in the visible range or in the invisible range, according to the application, for example, with a wavelength of around 900 nm invisible to the human eye.

Description of the Related Art

LIDAR (LIght Detection And Ranging or Laser Imaging Detection And Ranging) systems are appreciated for their 3D capacities and their capability of functioning in the dark and in unfavourable weather conditions. For instance, LIDAR systems in combination with video cameras and radar systems, are used for environmental mapping and for other safety applications in the automotive field, such as emergency braking, detection of pedestrians and collision avoidance.

Very short time pulses with high current (such as current pulses that have an intensity in the range of tens of amps with rise and fall times in the (sub)nanosecond time range, for example, of the order of 100 ps) are desirable for driving LASER diodes for LIDAR systems used for measuring distances with the use of time-of-flight (ToF) techniques with medium-to-low values of distance.

Arrays of LASER diodes comprising LASER diodes activated in sequence or in parallel are also used for improving the signal-to-noise (S/N) ratio in the return signal received. Multi-channel driver devices afford the possibility of selecting the diode (diodes) to be activated with a narrow current pulse of high intensity.

Generation of these narrow pulses with high intensity represents a challenge in the design of a driver device for LASER diodes.

A precise control of the duration of the pulses cannot be obtained by acting only on the switching times of a power switch: for example, the parasitic inductances of the interconnections limit the time derivative of the current i (di/dt) during rise and fall of the current i and markedly affect the duration of the pulses. Additional problems arise during driving of multiple LASER diodes connected with common cathode in an array.

Figure 1A:
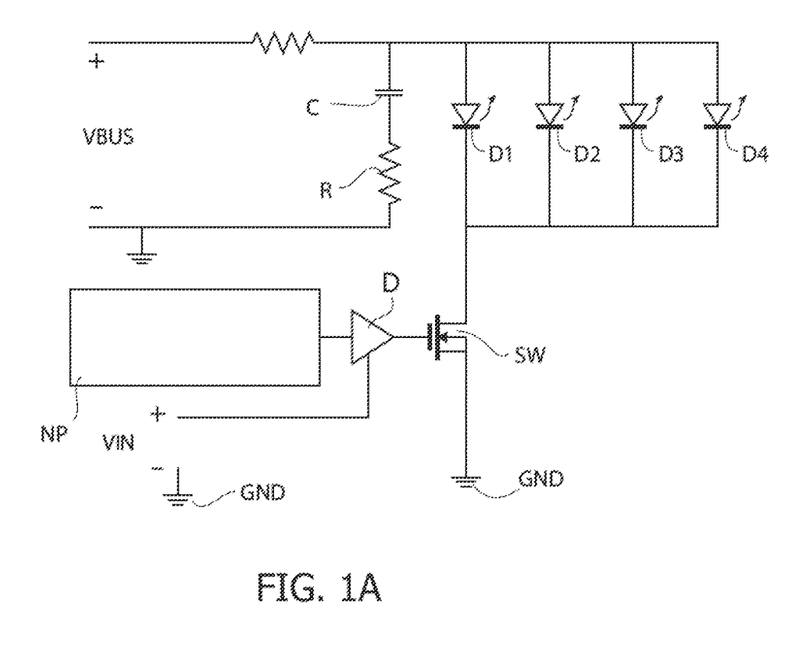
FIG. 1A is an example of a block diagram of a conventional system comprising an array of LASER diodes and an associated generator of control pulses.

FIG. 1A is a general representation of a conventional system comprising several LASER diodes D1, D2, D3, D4 (for example, four) in a common-anode/common-cathode configuration, which are supplied (on their anodes) by a supply bus at a voltage VBUS (referenced to ground GND) by an RC circuit.

The cathodes of the LASER diodes D1, D2, D3, D4 are jointly coupled to an associated electronic switch, such as a field-effect transistor (FET).

The switch SW may be selectively activated in a closed state (switch rendered conductive) to send the cathodes of the LASER diodes D1, D2, D3, D4 to ground so that light is emitted by the forward-biased diodes D1, D2, D3, D4.

The operation of the switch SW is controlled by a driving stage D coupled to the control terminal (the gate, in the case of a FET) of the switch SW.

The operation of the driving stage D, which receives an input voltage VIN (referenced to ground GND), is controlled by a generator of narrow pulses NP.

Figure 1B:
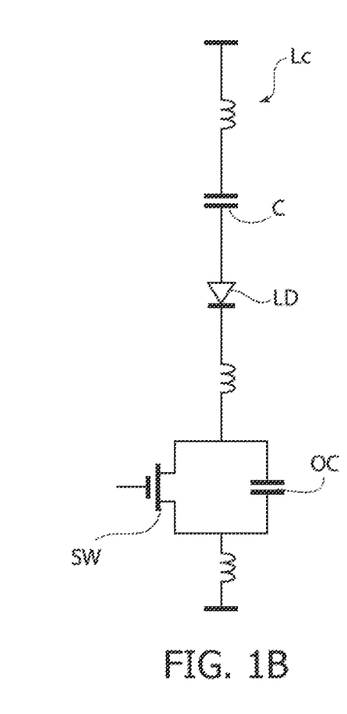
FIG. 1B is a circuit diagram of an equivalent circuit of a switching loop in the system of FIG. 1A.

FIG. 1B illustrates an equivalent circuit of a switching loop. In FIG. 1B:
the symbol LD denotes in general a LASER diode, illustrated with an associated series parasitic inductance; and SW is the electronic switch (implemented, for example, as a FET) illustrated with an associated (parallel) output capacitance OC and an associated series parasitic inductance.

As illustrated, a ceramic capacitor C may be used as a fast energy-storage device for driving a pulse current into the LASER diode LD by using the fast power switch SW connected in series to the capacitor C and to the LASER diode in a switching loop. The parasitic (dispersion) inductances of the interconnections of the switching loop are illustrated in FIG. 1A, are designated as a whole by Lc, and may be higher than 1 nH.

Solutions like the ones illustrated in FIGS. 1A and 1B suffer from a certain number of drawbacks, in particular, the parasitic inductance (or inductances) cannot be reduced as would be desirable to obtain a high value of di/dt (for example, rise and fall times of 100 ps for current pulses with high amplitude) since the length of the switching loop is affected by the size of the capacitor; the value of the current of a LASER diode is difficult to control only though the process of discharge of the capacitor: in essence, the current will in practice depend upon the impedance of the switching loop; countering an undesired spurious activation of non-selected LASER diodes (as may possibly be generated by the resonance of parasitic inductances with parasitic capacitances in the switching loop) will entail the need for additional switches arranged in parallel with the LASER diodes.

To limit the aforementioned drawbacks, by reducing the parasitic inductances and the corresponding undesired effects, solutions are known that envisage assembly of a LASER diode directly on a printed-circuit board (PCB) by soldering one of the terminal anode or the cathode terminal to the PCB and connecting the other anode or cathode terminal by wire bonding. The disadvantage of this solution lies in the fact that the inductance deriving from the connection by wire bonding has a value of the order of 1 nH, which is high for applications in which, as discussed above, precise control of the duration and of the rise/fall of the pulses of the LASER diode is important.

Other solutions are known, which, however, do not enable a significant reduction of the value of parasitic inductances of the control or driving circuit of the LASER diode.

For example, embedding LASER diodes in a PCB is a state-of-the-art process to reduce interconnection length and inductance. With this process, the LASER diode is housed on the PCB at the power switch pads. The LASER diode can be soldered directly onto the PCB so that both the anode and cathode terminals can be contacted without wire bonding. In this way, the length of the metal traces on the PCB can be reduced, resulting in parasitic inductances in the order of tens of pH. However, this solution has disadvantages, which are listed below.

The emitting side of the LASER diode would have to extrude outside the PCB in order to be emitted unobstructed by the PCB itself; however, this is difficult to achieve with current PCB technology and integrated or embedded LASER diodes. To overcome this difficulty, PCBs that are transparent to the wavelength of the LASER diode (e.g. 900 nm) are typically used so that they do not obstruct the propagation of the LASER beam.

In addition, the LASER diode requires or otherwise relies on a connection technology with limited mechanical stress, and this technology is not compatible with standard PCB assembly (compromises or hybrid technologies must therefore be accepted).

Furthermore, the non-emitting side of the LASER diode must not be subjected to mechanical stress that could damage the mirror inside the package housing the LASER diode. This condition is difficult to achieve on a PCB with an embedded or integrated LASER diode.

Furthermore, the process of soldering the LASER diode to the PCB must not generate contamination of the LASER diode, in particular contamination caused by the use of a soft solder (this is not guaranteed with standard PCB technology, which involves the use of "stencils").

US 2018/0278011A1 relates to a LASER diode module, where the LASER diode is integrated or embedded in the module structure, soldered to a dedicated board or lead frame. This solution requires dedicated metal interconnects, solder joints, and mechanical reliability that make it suboptimal, as well as potentially subject to the disadvantages discussed above.

US2018/301875A1 describes a LASER array including a plurality of emitters arranged in rows and columns on a substrate.

Document CN211265963U describes a packaging module of a LASER diode.

None of these further solutions overcome the disadvantages discussed above.

BRIEF SUMMARY

The present disclosure provides various embodiments which contribute to tackling adequately the problems discussed previously.

In various embodiments, the present disclosure provides an electronic module for generating pulses and a method for manufacturing the electronic module are provided.

In at least one embodiment, an electronic module for generating light pulses is provided that includes an interface card having a first and a second side opposite to one another. A lighting module, having a front side and a back side, houses one or more emitter devices that emit the light pulses, and the emitter devices have a common biasing terminal on the back side and respective one or more dedicated biasing terminals on the front side. A driver module is operatively coupled to the lighting module, and configured to generate biasing signals of the one or more emitter devices in order to control generation of said light pulses. The interface card has, at the first side, a recess provided with an electrical contact pad on a bottom of the recess, a through via, which forms an electrical connection towards the first side, and a conductive track, which electrically connects the electrical contact pad to the through via. The lighting module is housed in the recess with the common biasing terminal coupled to the electrical contact pad by a conductive adhesive layer or layer of glue. The driver module is arranged facing the front side of the lighting module and the first side of the interface card, and is electrically coupled to the dedicated biasing terminals and to the through via by respective regions of conductive solder paste.

In at least one embodiment, a method for manufacturing an electronic module for generating light pulses is provided that includes: providing an interface card, having a first and a second side opposite to one another; coupling, to the interface card, a lighting module having a front side and a back side and housing one or more emitter devices that emit said light pulses and have a common biasing terminal on the back side and respective one or more dedicated biasing terminals on the front side; and coupling, to the lighting module, a driver module configured to generate biasing signals of the one or more emitter devices for controlling generation of said light pulses, shaping the interface card on the first side to form a recess; forming an electrical contact pad on a bottom of the recess, the electrical contact pad being electrically connected by a conductive track to a through via of the interface card, the through via forming an electrical connection towards the first side; arranging a conductive adhesive layer, or layer of glue, on the common biasing terminal of the lighting module; arranging the lighting module in the recess and coupling the common biasing terminal to the electrical contact pad by the conductive adhesive layer, or layer of glue; forming respective regions of conductive solder paste on the dedicated biasing terminals and on the through via; arranging the driver module so that it faces the front side of the lighting module and the first side of the interface card; and electrically coupling the driver module to the dedicated biasing terminals and to the through via by said regions of conductive solder paste.

In at least one embodiment, a LIDAR system is provided that includes the electronic module for generating light pulses.

BRIEF DESCRIPTION OF THE SEVERAL VIEWS OF THE DRAWINGS

The characteristics and advantages of the embodiments will become evident from the ensuing detailed description of practical implementations thereof, represented by way of non-limiting example in the annexed drawings, wherein.

DETAILED DESCRIPTION

Figure 2:
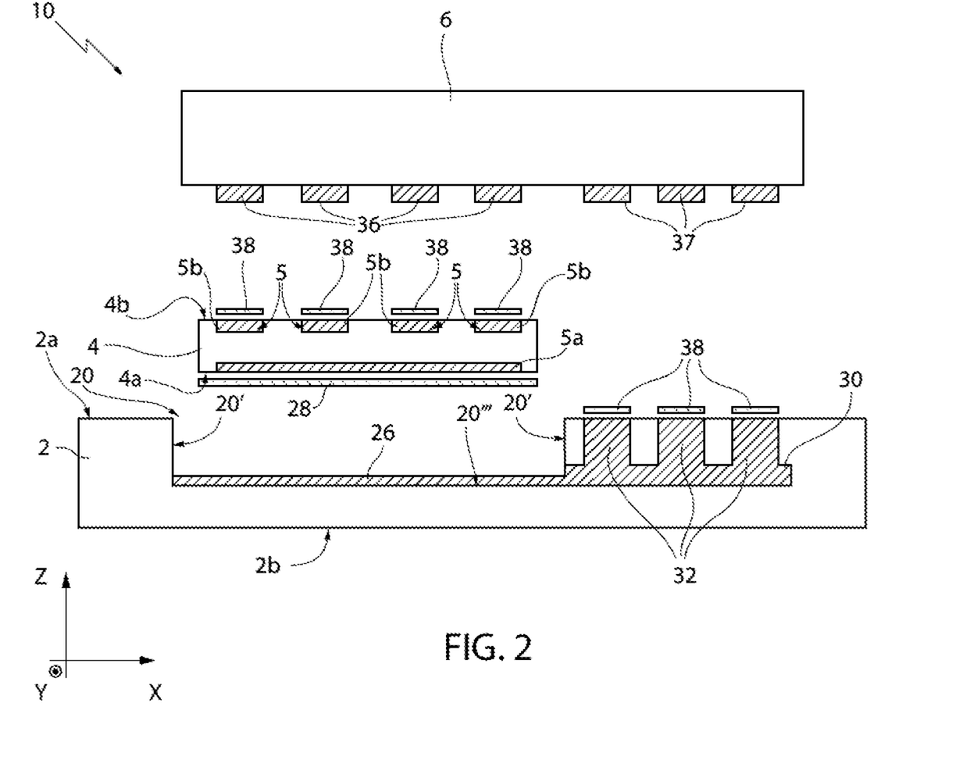
FIG. 2 is an exploded view of functional blocks of an electronic module, including a die that houses an array of LASER diodes, an interposer, and a driver module, according to an aspect of the present disclosure.

FIG. 2 is an exploded view of functional blocks belonging to an electronic module 10, according to an aspect of the present disclosure, in a triaxial system of mutually orthogonal axes X, Y, Z. The electronic module 10 is, by way of non-limiting example, a LIDAR module (or part thereof) for use in the automotive sector.

The electronic module 10 comprises:

an electrical and/or electronic interface substrate, or card, 2 (also known as "interposer"), used for routing electrical signals, in particular by conductive tracks or traces and through interconnections or vias that enable the electrical signals to be carried from one side of the card 2 to an opposite side of the card 2 (for example, to facilitate connection to a PCB on which the card 2 can be mounted);

a lighting module 4, comprising a die, which houses, at least partially in integrated form, one or more LASER diodes 5 (for example, an array of LASER diodes); the LASER diodes 5 have a common cathode terminal 5a on a back side 4a of the die 4 and respective anode terminals 5b on a front side 4b of the die 4, and can be controlled (driven) for emitting light pulses (in the visible or in the invisible); and a driver module 6, operatively coupled to the lighting module 4, configured to control (drive) the LASER diodes 5 in on-off mode by respective current pulses. In the case of an array of LASER diodes 5, the driver device 6 is a multi-channel driver device; in the case of a single LASER diode 5, the driver device 6 is of a single-channel type.

According to one aspect of the present disclosure, the card 2, or interposer, has a recess 20 at an outer edge thereof, in which the lighting module 4 is completely inserted. The driver module 6 is arranged on top of the card 2 and of the lighting module 4. The electrical connections between the driver module 6 and the lighting module 4, for driving the LASER diodes 5, are obtained without wire bonding in order to reduce the parasitic inductances.

By way of example, the card 2 is of a material chosen from the following: composite material including epoxy resin, or laminated plastic, for example, of the type known as FR-4; polyimide, polytetrafluoroethylene (PTFE), ceramic, and others still. The integrated conductive tracks are, for example, of Cu with NiAu finish.

The lighting module 4 comprises, in one embodiment, four LASER diodes 5. Moreover, irrespective of the number of LASER diodes 5, these LASER diodes 5 are arranged so that the emission of the respective light beam occurs at a same side of the lighting module 4, which is then coupled to the card 2 so that the side from which the light emission occurs is arranged at an outer edge of the card 2 and oriented towards the outside of the card 2. The lighting module 4 is of a per se known type and is therefore not described any further in detail.

In one embodiment presented by way of example, the driver module 6 has a number of control channels equal to the number of LASER diodes present on the lighting module 4, for example, four channels. In addition, the driver module 6 is based upon GaN transistors.

Driver devices or modules for LASER diodes with rise and fall times in the range of 100 ps are desirable, given that reducing as far as possible the duration of the pulses facilitates maintenance of the energy emitted by a LASER diode below the safety limits. At the level of a driver device for LASER diodes, this means enabling very high values for di/dt (i.e., the time derivative of the current generated by the driver device); i.e., it is expected to be able to switch high currents in a very short time.

The driver module 6 includes a driving circuit for short-pulse and high-current LASER diodes (i.e., ones in the nanosecond range), with switches implemented with GaN transistors that meet the aforementioned requirements, in particular for LIDAR applications. The driver module 6 is of a per se known type and in itself does not form the subject of the present disclosure and consequently is not discussed in detail.

Purely by way of example, a driver module 6 is described in E. Abramov et al., "Low voltage sub-nanosecond pulsed current driver IC for high-resolution LIDAR applications," 2018 IEEE Applied Power Electronics Conference and Exposition (APEC), San Antonio, TX, 2018, pp. 708-715. See also the publication of Texas Instruments "TI Designs: TIDA-01573 Nanosecond Laser Driver Reference Design for LIDAR".

In order to reach the aforementioned values of rise and fall times (in the range of 100 ps or lower), the present disclosure envisages elimination of the wire bonding between the lighting module 4 and the card 2 and between the lighting module 4 and the driver module 6.

Figure 3A:
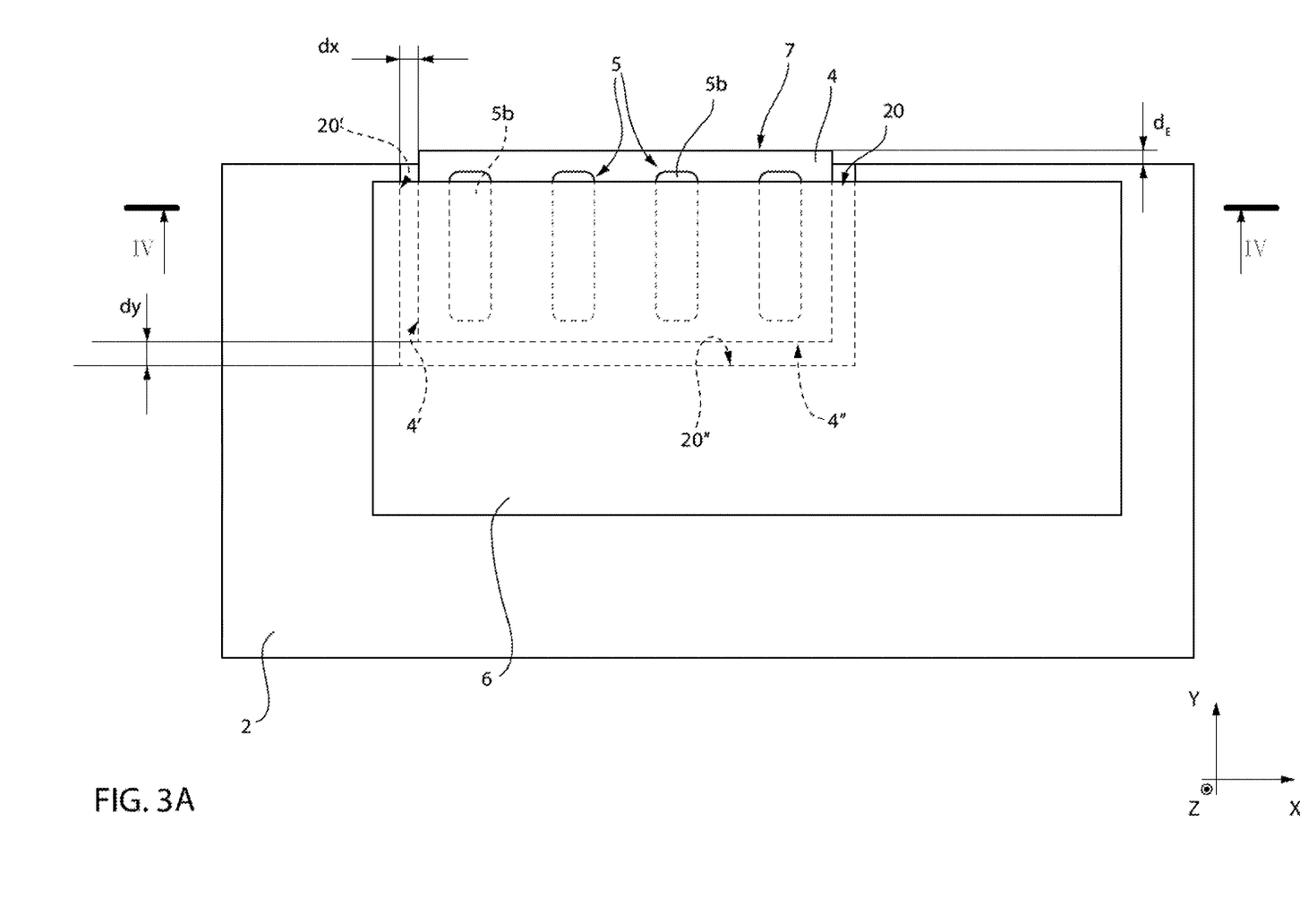
FIG. 3A is a top view of the interposer of FIG. 2, according to an aspect of the present disclosure.

The card 2 is modelled as illustrated in FIG. 3A (in top view), and has the edge recess 20 sized so as to house the lighting module 4. In particular, the edge recess 20 has dimensions along the directions of the axes X and Y greater than the respective dimensions of the lighting module 4. In this way, when the lighting module 4 is arranged in the edge recess 20, spaces or distances $d_X$, $d_Y$ are present (respectively along the axes X and Y) between the side walls 20', 20" of the edge recess 20 and the side walls 4', 4" of the lighting module 4 that directly face the walls 20', 20", respectively. The presence of the distances $d_X$, $d_Y$ has the function of preventing transmission of thermal and/or mechanical stresses from the card 2 to the lighting module 4, and/or vice versa. The value of the distance $d_X$ is, for example, chosen in the 10 μm-20 μm range; the value of the distance $d_Y$ is, for example, chosen in the 10 μm-200 μm range.

It is evident that, in the case where it is decided to accept or handle differently the stresses that may be transmitted from the card 2 to the lighting module 4, and/or vice versa, one or both of the distances $d_X$, $d_Y$ can be set to zero, i.e., one or both of the walls 4', 4" of the lighting module 4 can be set in direct contact with the respective walls 20', 20" of the edge recess 20.

The depth, along the axis Z, of the edge recess 20 is chosen equal to the thickness of the lighting module 4, for example, in the 100-120 μm range.

The emitter side 7 of the lighting module 4 is directly exposed to the environment external to the edge recess 20, i.e., it does not face any side of the edge recess 20 so that the beams emitted are not hindered or intercepted by portions of the edge recess 20 or of the card 2.

Furthermore, in an optional embodiment, and as represented in FIG. 3A, the lighting module 4 extends in cantilever fashion (or protrudes) from the outer edge of the card 2, for a distance equal to $d_E$ comprised between 0 and 5 μm. This solution has the further purpose of preventing portions of the edge recess 20 and/or of the card 2 from hindering or interfering with the beams emitted by the lighting module 4.

When mounted in the edge recess 20, the lighting module 4 is oriented so that, during operation, one or more light beams are emitted in a direction away from the card 2.

Figure 3B:
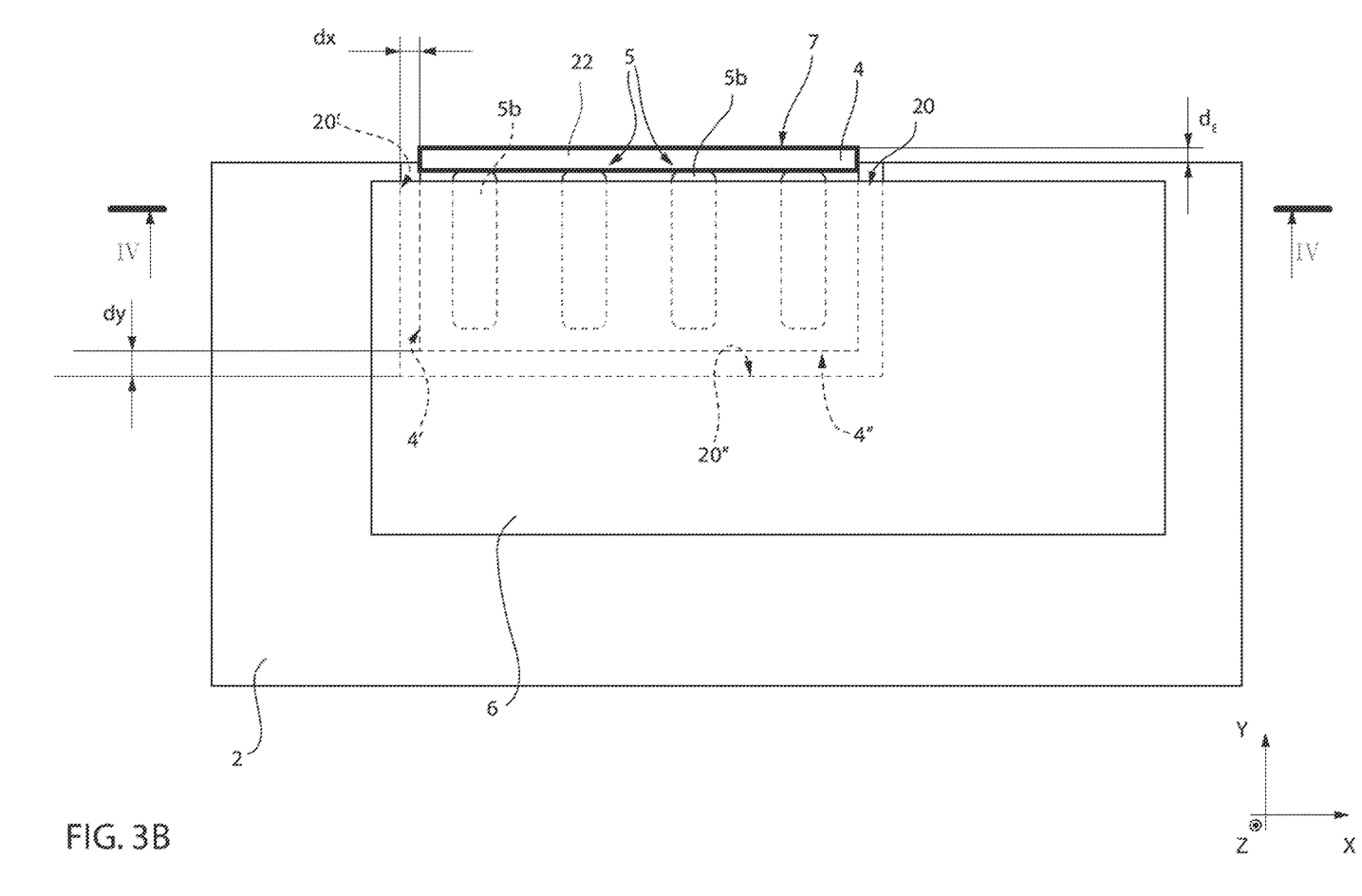
FIG. 3B is a top view of the interposer of FIG. 2, according to another aspect of the present invention.

According to a further embodiment, as shown in FIG. 3B, it is further provided, at the emitter side 7, a protective shield, or screen, 22 of glass or other material (e.g., plastic) transparent to the radiation emitted by the LASER diodes. The protective shield 22 is arranged and configured such that the one or more light beams emitted by the LASER diodes pass through the protective shield 22. The protective shield 22 is applicable to the embodiment in which the illumination module 4 extends in cantilever fashion (or protrudes) from the outer edge of the board 2; in this case, also the protective shield 22 that protrudes, at least partially, from the outer edge of the board 2. Alternatively, the protective shield 22 may be applied in the absence of such protrusion.

The protective shield may be integrated with the illumination module 4, with the card 2, or otherwise coupled to at least one of them (e.g., the protective shield may be a physically separate element from the illumination module 4 and the card 2, and be physically coupled to the illumination module 4 and/or the card 2, and optically coupled to the illumination module 4 to transmit the emitted light beams). The protective screen 22 may be coupled in particular by means of optical glue, compatible with (transparent to) the emitted light radiation.

Although in FIG. 3B the protective shield 22 is shown completely contained (in top plan view) within the illumination module 4 (i.e., it does not protrude beyond the emitter side 7), in a different embodiment, not shown, the protective shield 22 may protrude beyond the emitter side 7.

To enable an electrical connection between the common cathode 5a and conductive tracks of the card 2, the edge recess 20 has, at its bottom wall 20''', a conductive pad 26, in particular of metal, configured to be set in electrical contact with the common cathode 5a of the LASER diodes 5. The mechanical coupling between the common cathode 5a and the conductive pad 26 is provided by an adhesive layer 28 for coupling dice, also known as die attach film (DAF). More in particular, the adhesive layer 28 is electrically conductive (also known as conductive die attach film—CDAF), so that the adhesive layer 28 provides both the mechanical and the electrical coupling between the common cathode 5a and the conductive pad 26. Other embodiments may be envisaged, where the adhesive layer 28 is replaced by solder balls or by a conductive glue, or yet other solutions.

The conductive pad 26 is coupled to one or more conductive tracks 30 integrated or buried, at least partially, in the card 2 (for example, formed at intermediate metal levels of the card 2); these one or more conductive tracks 30 are in turn coupled to conductive through vias 32, which reach a top face 2a and/or a bottom face 2b of the card 2. Here, the through vias 32 may be contacted to receive electrical biasing signals of the common cathode 5a (for example, a ground reference signal), for operation of the LASER diodes 5.

According to an aspect of the present disclosure, the driver module 6 is a die designed to be arranged on top of the card 2 (on the face 2a) and of the lighting module 4 arranged in the edge recess 20. For this purpose, the driver module has a plurality of conductive pads 36, 37 arranged so that, when the driver module is arranged facing the top face 2a of the card 2 and the lighting module 4, the conductive pads 36 are directly facing the anode terminals 5b of the LASER diodes 5, and the conductive pads 37 directly face the conductive vias 32 that extend towards the top face 2a. To provide an electrical contact between the conductive pads 36 and the anode terminals 5b, conductive solder paste or conductive glue 38 is used. In particular, in one embodiment, the solder paste 38, or the conductive glue, is deposited by jet devices or jet printing techniques (in practice, the solder paste is deposited or printed exploiting the known technology of ink-jet printers); this solution enables high precision to be achieved, preventing formation of short-circuits between anode terminals 5b adjacent to one another. Other technical solutions may, however, be used; for example, conductive glue or solder balls, or other techniques may be used.

Likewise, the same solutions described above may be used for providing the electrical contact between the conductive pads 37 and the through vias 32, through which the biasing signal of the common cathode 5a is supplied.

In this way, the electrical biasing signals of the anode terminals 5b and of the common cathode terminal 5a can be supplied by the driver module 6 to the LASER diodes 5 by connections obtained without wire bonding that are such as to minimize parasitic inductances.

Figure 4:
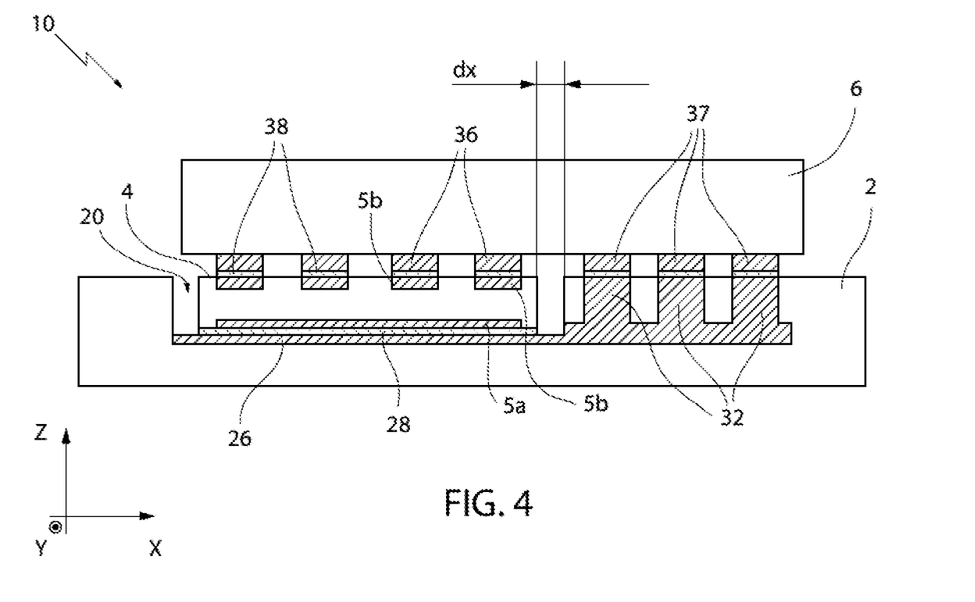
FIG. 4 illustrates the electronic module of FIG. 2 with the functional blocks operatively coupled together, according to an aspect of the present disclosure.

FIG. 4 illustrates the electronic module 10 in which the card 2, the lighting module 4, and the driver module 6 are coupled together, as described previously. The view of FIG. 4 is taken along the line of section Iv-Iv indicated in FIG. 3A.

Figure 5:
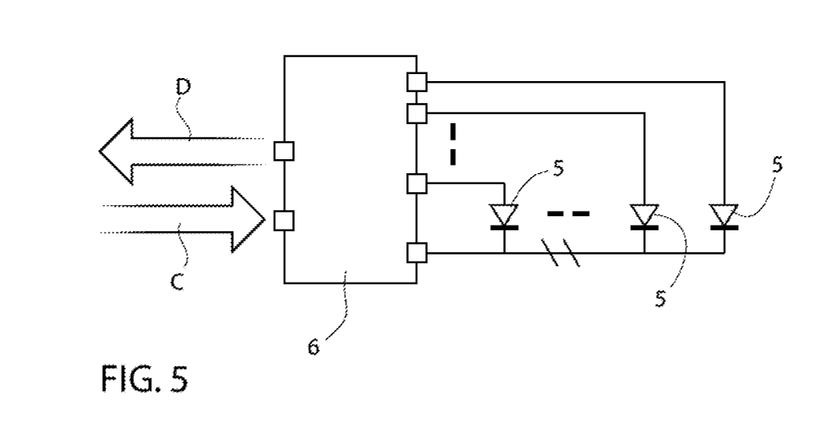
FIG. 5 is a schematic illustration of parts of a system for performing functions of current control, timing of the pulses, and diagnostics for a multi-channel driver device for an array of LASER diodes.

As represented by way of example in FIG. 5, the implementation of FIG. 4 may likewise facilitate integration in an integrated circuit (IC), such as a system on package, of the electronic module 10. The system of FIG. 5 may perform additional functions for control of current and timing of the pulses (these functions being denoted as a whole by C) and diagnostics (this function being denoted by D). It may be noted that such a configuration is not dedicated in itself to a multi-channel driver device for LASERs and a LASER array and can also be used a single-channel configuration, comprising a single LASER diode.

There now follows a description of a method for manufacturing the electronic module 10, limitedly to the steps useful for an understanding the present disclosure. The ensuing steps may be executed in any order, even simultaneously with one another, except where otherwise specified or evident in so far as they are necessarily consecutive to one another.

With reference to the card 2, an electronic card of a per se known type is provided, in particular known as "interposer". Interposers of a known type can be machined, by steps of dicing/patterning with the equipment commonly used for singulation of electronic cards, well known in the semiconductor industry. In particular, the machining according to the present disclosure envisages forming the edge recess 20 with the dimensions $d_X$ and $d_Y$ previously referred to and a depth along the axis Z chosen so as to house the lighting module 4, considering also the thickness of the adhesive layer 28 (or technical equivalent used).

With reference to the lighting module 4, the steps for its manufacture are not described in so far as they are per se known and do not form the subject of the present disclosure. The adhesive layer 28 (for example, CDAF) is coupled to the common cathode 5a. Typically, the lighting modules 4 are manufactured in series, providing on a same semiconductor wafer a plurality of lighting modules 4, which are then singulated by a dicing step. In this case, the adhesive layer 28 is coupled to the entire wafer prior to the dicing step.

The step of coupling between the lighting module 4 and the edge recess 20 may envisage, according to the type of adhesive layer 28 used, a step of curing, for example, a thermal treatment.

The step of deposition of the solder paste 38 is performed by jet devices by depositing or printing solder paste exploiting a technology similar to that of ink-jet printers. Apparatuses for printing solder paste are known in the prior art.

Figure 6:
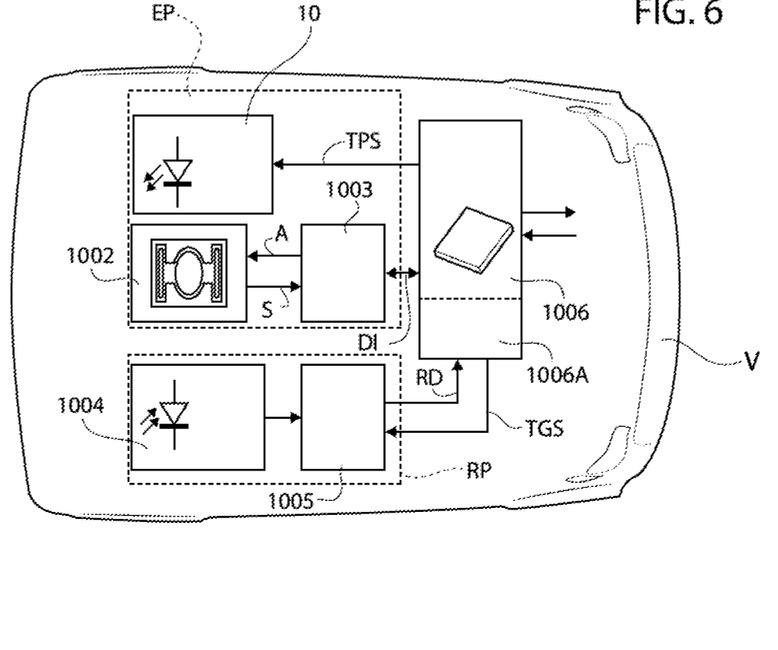
FIG. 6 illustrates a possible architecture of a LIDAR system for the automotive sector, comprising the electronic module of FIG. 4.

FIG. 6 is an example of the possible use of the present embodiments in LIDAR equipment for a vehicle V, such as a car, the equipment comprising an emitter path EP and a receiver path RP.

As illustrated, the emitter path EP comprises:

an electronic module 10 of the type described previously;

a LIDAR-mirror module 1002 (for example, a MEMS mirror module) which receives actuation signals A from, and provides sensing signals S to, a mirror driver (for example, an ASIC) 1003, for instance with the capacity to light up a surrounding scene with a vertical LASER beam and carry out a horizontal scan, as is desirable in order to detect, in a reliable way, a pedestrian at a distance of a few metres.

The receiver path RP comprises:

a photodiode module 1004 sensitive to the reflected signal produced as a result of a reflection of the light radiation by the emitter path EP on objects lit up by said radiation, and an associated receiving circuitry 1005, coupled to the photodiode module 1004.

The reference number 1006 in FIG. 6 designates a controller (for example, a multicore-microcontroller architecture, possibly comprising dedicated LIDAR FPGAs/hardware accelerators 1006A) configured to:

emit signals for triggering and setting the LASER power TPS in the LASER lighting system;

exchange driving information DI with the driver device 1003 of the LIDAR mirror modules 1002; and receive raw data RD from and send triggering and gain-set information TGS to the receiving circuitry 1005 coupled to the photodiode module 1004.

It may be noted that, except for the characteristics of the present disclosure discussed previously, the general architecture illustrated in FIG. 6 may be considered, on the other hand, as conventional in the art, which renders superfluous providing any more detailed description herein.

This applies, for example, with reference to co-ordination of operation of the LIDAR equipment of FIG. 6 with operation of the equipment in the vehicle V (for example, in regard to the configuration data received in the controller 1006 and state-points cloud information, as emitted by the controller 1006).

In summary, circuits like the ones represented by way of example herein, together with the electrical configuration (without wire bonding) of the electronic module 10 described above, facilitate fast switching with rise and fall times in the range of 100 ps or less, which in turn facilitates generation of controlled pulses in the range of 1 ns, with an amplitude of the current in the range of tens of amps.

The advantages afforded by the present disclosure emerge clearly from the foregoing description.

In particular, direct connection (i.e., in the absence of wire bonding) of the driver module 6 with the LASER diodes 5 that uses an interposer 2 with an edge recess 20 and a semiconductor standard assembly process enables drastic reduction of the parasitic inductances present in known systems/circuits. The technology is compatible with the requirements of assembly of dice that integrate LASER diodes in so far as it does not generate soldering stresses, contamination, or significant thermal and mechanical stresses.

An electronic module (10) for generating light pulses, may be summarized as including: an interface card (2), having a first (2a) and a second (2b) side opposite to one another; a lighting module (4), having a front side (4b) and a back side (4a), housing one or more emitter devices (5) that emit said light pulses, the emitter devices (5) having a common biasing terminal (5a) on the back side (4a) and respective one or more dedicated biasing terminals (5b) on the front side (4b); and a driver module (6), operatively coupled to the lighting module (4), configured to generate biasing signals of said one or more emitter devices (5) in order to control generation of said light pulses, characterized in that: the interface card (2) has, at the first side (2a), a recess (20) provided with an electrical contact pad (26) on a bottom (20''') of the recess (20), a through via (32), which forms an electrical connection towards the first side (2a), and a conductive track (30), which electrically connects the electrical contact pad (26) to the through via (32); the lighting module (4) is housed in said recess (20) with the common biasing terminal (5a) coupled to the electrical contact pad (26) by a conductive adhesive layer, or layer of glue, (28); and said driver module (6) is arranged facing the front side (4b) of the lighting module (4) and the first side (2a) of the interface card (2), and is electrically coupled to the dedicated biasing terminals (5b) and to the through via (32) by respective regions of conductive solder paste (38).

The lighting module (4) may have an emission surface (7) arranged at, or that protrudes from, an outer edge of the interface card (2), said recess (20) being at said outer edge of the interface card (2). The lighting module (4) may have, at the emission surface (7), a protective shield (22) of a material transparent to said light pulses. The recess (20) may have dimensions such that the lighting module (4) is completely housed in the recess (20), at a distance from side walls of the recess (20). The one or more emitter devices (5) may be LASER diodes. The common biasing terminal (5a) of the lighting module (4) may be a cathode terminal, and the dedicated biasing terminals (5b) may be anode terminals. The driver module (6) may include a plurality of driving nodes that are electrically coupled to the dedicated biasing terminals (5b) and to the through via by said respective regions of conductive solder paste. The interface card (2) may be of a plastic laminated material provided with buried conductive tracks. The conductive adhesive layer (28) may be a CDAF.

A method for manufacturing an electronic module (10) for generating light pulses, may be summarized as including the steps of: providing an interface card (2), having a first (2a) and a second (2b) side opposite to one another; coupling, to the interface card (2), a lighting module (4) having a front side (4b) and a back side (4a) and housing one or more emitter devices (5) that emit said light pulses and have a common biasing terminal (5a) on the back side and respective one or more dedicated biasing terminals (5b) on the front side; and coupling, to the lighting module (4), a driver module (6) configured to generate biasing signals of said one or more emitter devices (5) for controlling generation of said light pulses, characterized in that it may further include the steps of: shaping the interface card (2) on the first side to form a recess (20); forming an electrical contact pad (26) on a bottom (20''') of the recess (20), said electrical contact pad (26) being electrically connected by a conductive track (30) to a through via (32) of the interface card (2), the through via forming an electrical connection towards the first side; arranging a conductive adhesive layer, or layer of glue (28), on the common biasing terminal (5a) of the lighting module (4); arranging the lighting module (4) in said recess and coupling the common biasing terminal (5a) to the electrical contact pad (26) by said conductive adhesive layer, or layer of glue (28); and forming respective regions of conductive solder paste (38) on the dedicated biasing terminals (5b) and on the through via; arranging said driver module (6) so that it faces the front side of the lighting module (4) and the first side of the interface card (2); and electrically coupling the driver module (6) to the dedicated biasing terminals (5b) and to the through via by said regions of conductive solder paste (38).

The lighting module (4) may have a surface for emission of said light pulses, wherein the step of forming the recess (20) may include shaping the interface card (2) at an outer edge of the interface card (2), and wherein the step of arranging the lighting module (4) in the recess (20) may include arranging the lighting module (4) at, or protruding from, an outer edge of the interface card (2). The step of arranging the lighting module (4) in the recess (20) may include arranging the lighting module (4) at a distance from side walls of the recess (20). The driver module (6) may include a plurality of driving nodes, and the step of electrically coupling the driver module (6) may include electrically coupling respective driving nodes to the dedicated biasing terminals (5b) and to the conductive via by said respective regions of conductive solder paste. The step of forming the regions of conductive solder paste (38) may include depositing conductive material by the jet printing technique.

A LIDAR system may be summarized as including an electronic module for generating light pulses according to the claims.

Variations and modifications may be made to the present disclosure, without thereby departing from the scope identified by the ensuing claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic module for generating light pulses, comprising:
   an interface card, having a first and a second side opposite to one another;
   a lighting module, having a front side and a back side, housing one or more emitter devices that emit the light pulses, the emitter devices having a common biasing terminal on the back side and respective one or more dedicated biasing terminals on the front side; and
   a driver module, operatively coupled to the lighting module, configured to generate biasing signals of the one or more emitter devices in order to control generation of said light pulses,
   wherein:
      the interface card has, at the first side, a recess provided with an electrical contact pad on a bottom of the recess, a through via, which forms an electrical connection towards the first side, and a conductive track, which electrically connects the electrical contact pad to the through via;
      the lighting module is housed in the recess with the common biasing terminal coupled to the electrical contact pad by a conductive adhesive layer or layer of glue; and
      the driver module is arranged facing the front side of the lighting module and the first side of the interface card, and is electrically coupled to the dedicated biasing terminals and to the through via by respective regions of conductive solder paste.

2. The electronic module according to claim 1, wherein the lighting module has an emission surface arranged at, or that protrudes from, an outer edge of the interface card, and the recess is disposed at the outer edge of the interface card.

3. The electronic module according to claim 2, wherein the lighting module has, at the emission surface, a protective shield of a material transparent to said light pulses.

4. The electronic module according to claim 1, wherein the recess is sized to completely house the lighting module in the recess, at a distance from side walls of the recess.

5. The electronic module according to claim 1, wherein the one or more emitter devices are LASER diodes.

6. The electronic module according to claim 4, wherein the common biasing terminal of the lighting module is a cathode terminal, and the dedicated biasing terminals are anode terminals.

7. The electronic module according to claim 1, wherein the driver module includes a plurality of driving nodes that are electrically coupled to the dedicated biasing terminals and to the through via by the respective regions of conductive solder paste.

8. The electronic module according to claim 1, wherein the interface card is of a plastic laminated material provided with buried conductive tracks.

9. The electronic module according to claim 1, wherein the conductive adhesive layer is a conductive die attach film (CDAF).

10. A method for manufacturing an electronic module for generating light pulses, comprising:
    providing an interface card, having a first and a second side opposite to one another;
    coupling, to the interface card, a lighting module having a front side and a back side and housing one or more emitter devices that emit said light pulses and have a common biasing terminal on the back side and respective one or more dedicated biasing terminals on the front side; and
    coupling, to the lighting module, a driver module configured to generate biasing signals of the one or more emitter devices for controlling generation of said light pulses,
    shaping the interface card on the first side to form a recess;
    forming an electrical contact pad on a bottom of the recess, the electrical contact pad being electrically connected by a conductive track to a through via of the interface card, the through via forming an electrical connection towards the first side;
    arranging a conductive adhesive layer, or layer of glue, on the common biasing terminal of the lighting module;
    arranging the lighting module in the recess and coupling the common biasing terminal to the electrical contact pad by the conductive adhesive layer, or layer of glue;
    forming respective regions of conductive solder paste on the dedicated biasing terminals and on the through via;
    arranging the driver module so that it faces the front side of the lighting module and the first side of the interface card; and
    electrically coupling the driver module to the dedicated biasing terminals and to the through via by said regions of conductive solder paste.

11. The method according to claim 10, wherein the lighting module has a surface for emission of the light pulses, wherein the forming the recess comprises shaping the interface card at an outer edge of the interface card, and wherein the arranging the lighting module in the recess comprises arranging the lighting module at, or protruding from, an outer edge of the interface card.

12. The method according to claim 10, wherein the arranging the lighting module in the recess comprises arranging the lighting module at a distance from side walls of the recess.

13. The method according to claim 10, wherein the driver module includes a plurality of driving nodes, and the electrically coupling the driver module comprises electrically coupling respective driving nodes to the dedicated biasing terminals and to the conductive via by the respective regions of conductive solder paste.

14. The method according to claim 10, wherein the forming the regions of conductive solder paste comprises depositing conductive material by the jet printing technique.

15. A LIDAR system, comprising:
an electronic module for generating light pulses, the electronic module including:
an interface card, having a first and a second side opposite to one another;
a lighting module, having a front side and a back side, housing one or more emitter devices that emit the light pulses, the emitter devices having a common biasing terminal on the back side and respective one or more dedicated biasing terminals on the front side; and
a driver module, operatively coupled to the lighting module, configured to generate biasing signals of the one or more emitter devices in order to control generation of said light pulses, wherein:
the interface card has, at the first side, a recess provided with an electrical contact pad on a bottom of the recess, a through via, which forms an electrical connection towards the first side, and a conductive track, which electrically connects the electrical contact pad to the through via;
the lighting module is housed in the recess with the common biasing terminal coupled to the electrical contact pad by a conductive adhesive layer or layer of glue; and
the driver module is arranged facing the front side of the lighting module and the first side of the interface card, and is electrically coupled to the dedicated biasing terminals and to the through via by respective regions of conductive solder paste.

16. The LIDAR system according to claim 15, further comprising:
a mirror driver; and
LIDAR-mirror circuitry configured to receive actuation signals from, and provide sensing signals to, the mirror driver.

17. The LIDAR system according to claim 16, wherein the system is disposed in a vehicle.

18. The LIDAR system according to claim 15, wherein the lighting module has an emission surface arranged at, or that protrudes from, an outer edge of the interface card, and the recess is disposed at the outer edge of the interface card.

19. The LIDAR system according to claim 18, wherein the recess is sized to completely house the lighting module in the recess, at a distance from side walls of the recess.

20. The LIDAR system according to claim 15, wherein the common biasing terminal of the lighting module is a cathode terminal, and the dedicated biasing terminals are anode terminals.

* * * * *